United States Patent
Xu et al.

(10) Patent No.: US 8,848,829 B2
(45) Date of Patent: Sep. 30, 2014

(54) CIRCUIT AND TRANSMITTER FOR REDUCING TRANSMITTER GAIN ASYMMETRY VARIATION

(75) Inventors: Bing Xu, Gilbert, AZ (US); Neric Fong, Santa Clara, CA (US); Chao Lu, Fremont, CA (US)

(73) Assignee: Mediatek Singapore Pte. Ltd., Singapore (SG)

( * ) Notice: Subject to any disclaimer, the term of this patent is extended or adjusted under 35 U.S.C. 154(b) by 37 days.

(21) Appl. No.: 13/555,551

(22) Filed: Jul. 23, 2012

(65) Prior Publication Data

US 2013/0279630 A1    Oct. 24, 2013

Related U.S. Application Data

(60) Provisional application No. 61/637,747, filed on Apr. 24, 2012.

(51) Int. Cl.
| | |
|---|---|
| *H04L 25/49* | (2006.01) |
| *H03F 3/68* | (2006.01) |
| *H03G 5/16* | (2006.01) |
| *H04B 1/04* | (2006.01) |
| *H03G 3/00* | (2006.01) |
| *H03G 3/30* | (2006.01) |

(52) U.S. Cl.
CPC ............... *H04B 1/0475* (2013.01); *H03F 3/68* (2013.01); *H03G 5/165* (2013.01); *H03G 3/001* (2013.01); *H03G 3/3052* (2013.01)
USPC ............ 375/297; 375/295; 375/345; 375/296

(58) Field of Classification Search
USPC .................... 375/297, 295, 345, 296
See application file for complete search history.

(56) References Cited

U.S. PATENT DOCUMENTS

| | | | | |
|---|---|---|---|---|
| 7,092,043 | B2 * | 8/2006 | Vorenkamp et al. | 348/726 |
| 7,680,227 | B2 * | 3/2010 | Kavadias et al. | 375/354 |
| 7,881,402 | B2 * | 2/2011 | Gao et al. | 375/296 |
| 7,894,547 | B2 * | 2/2011 | Fortier et al. | 375/297 |
| 7,941,115 | B2 | 5/2011 | Aniruddhan et al. | |
| 2006/0035617 | A1 * | 2/2006 | Kim | 455/323 |
| 2006/0068746 | A1 * | 3/2006 | Feng et al. | 455/323 |
| 2010/0120369 | A1 * | 5/2010 | Ko et al. | 455/67.11 |
| 2011/0227642 | A1 * | 9/2011 | Hoyerby et al. | 330/109 |
| 2012/0087451 | A1 * | 4/2012 | Razzell | 375/350 |
| 2012/0274370 | A1 * | 11/2012 | Fortier et al. | 327/156 |
| 2013/0021934 | A1 * | 1/2013 | Rugamer et al. | 370/252 |

* cited by examiner

*Primary Examiner* — Kenneth Lam
(74) *Attorney, Agent, or Firm* — Sawyer Law Group, P.C.

(57) ABSTRACT

The present invention provides for a circuit with slicing wherein a gain asymmetry variation is decreased across the plurality of mixer slices. In one or more embodiments, a calibration unit can be provided to determine the characteristics of gain asymmetry variation; and a digital compensation unit can be provided to adjust the gain of the circuit over frequency.

15 Claims, 7 Drawing Sheets

CIRCUIT AND TRANSMITTER FOR REDUCING TRANSMITTER GAIN ASYMMETRY VARIATION

CROSS-REFERENCE TO RELATED APPLICATIONS

This application claims benefit under 35 USC 119(e) of Provisional Application Ser. No. 61/637,747, filed on Apr. 24, 2012.

FIELD OF THE INVENTION

The present invention relates generally to the electronic circuits, and more particularly to radio frequency (RF) circuits and lessening gain asymmetry variation.

BACKGROUND OF THE INVENTION

RF circuits of transceivers, transmitters and receivers are in demand in today's markets as these devices are used in numerous electronic applications worldwide. RF circuits often provide for mixed-signal systems on a chip and may involve wireless applications for highly integrated system applications. Various architectures are used for transceivers in radio link applications, including a zero-Intermediate frequency (IF) or direct conversion (DC).

FIG. 1 depicts an RF front end circuit comprising an RC filter. From FIG. 1, the RC filter 200 includes a resistor-capacitor circuit 210, a mixer 220, and an amplifier 230. The RC filter 200 is devoid of slicing capability. Input is at 240 and output of the circuit is at 250. RC circuits are often deployed to filter a signal by providing for blocking certain frequencies and passing other frequencies. It will be appreciated by those skilled in the art that RC filters include high-pass filters and low-pass filters.

FIG. 2 depicts a typical topology 300 used in a transmitter for a radio frequency (RF) transceiver or chipset. In FIG. 2, the topology includes a resistor-capacitor (RC) circuit 310 having a voltage source 315, operatively connected with the n mixers (320a-320n) and their respective amplifiers (330a-330n) to provide n switchable amplified split or sliced signal outputs (slice 1 through slice n) that are combined at 340. The combined amplified signals are then provided as input 350 to connected circuitry or devices. The RC circuit 310 may a RC filter or RC network as well where it is minimally an electric circuit composed of resistors and capacitors driven by a voltage or current source. Typically a first order RC circuit is composed of one resistor and one capacitor.

Typically chipsets and transceivers of the topology of FIG. 2, during transmission, output signals typically yield wider bandwidth and show varying gain asymmetry in relation to the slicing. Additionally, when switching between slices, the RC filter may be affected by differing impedance values and therefore affect alternating current (AC) responses. Other aspects of the output may be assessed in terms of any of the following quantifiable characteristics, including:

a. Spectral flatness, a measure of consistency of power density over frequency offset from carrier frequency, often in decibels;
b. Error vector magnitude (EVM) which is understood to be a measure of performance of a digital radio transmitter or receiver reflecting imperfections such as carrier leakage, low image rejection ratio, phase noise etc., causing deviation of the constellation points ideal location points;
c. Adjacent-channel leakage ratio (ACLR) which is understood to be the ratio of the integrated signal power in the adjacent channel to the integrated signal power in the main channel;
d. Long calibration time creating inefficiencies; and,
e. Digital to Analog Converter (DAC) headroom which is understood to be the overhead bit data, other than signal and noise bits, that are needed to prevent overflow.

Typically, gain symmetry characteristics where there is no RC filter slicing will yield differing shapes of frequency versus peak gain when number of slices at mixers (320a-320n) and their respective amplifiers (330a-330n) changes. Further, amp-frequency plots demonstrate curve changes are affected by band, slicing and R/C values but are generally unaffected by temperature and segments.

It is desired to have an improved slicing method and circuit including the RC filter so it may be driven by a low impedance voltage source which can also provide a more consistent gain step when switching between slices. It is desirable to achieve a consistent AC response over gain setting resulting in less calibration time and complexity, a reasonable DAC headroom, and consistent gain asymmetry shape across all slices. Further desired benefits may also include being able to digitally compensate to flatten the composite transmitter lineup gain over frequency. Therefore, a solution to provide a have an improved slicing method and RC filter circuit capable of being driven by a low impedance voltage source that can also provide a more consistent gain step when switching between slices is desired.

As used herein the terms device, apparatus, system, etc. are intended to be inclusive, interchangeable, and/or synonymous with one another and other similar arrangements and equipment for purposes of the present invention though one will recognize that functionally each may have unique characteristics, functions and/or operations which may be specific to its individual capabilities and/or deployment. It will be appreciated by those skilled in the art that the present invention is applicable to a wide variety of devices, including those associated with communications such as a transmitter, receiver, transceiver and similar devices, all within the scope of the present invention and its various embodiments herein.

SUMMARY OF THE INVENTION

The present invention fulfills these needs and has been developed in response to the present state of the art, and in particular, in response to the problems and needs in the art that have not yet been fully solved by currently available technologies.

In one or more embodiments, a circuit is provided, comprising: means for providing a consistent system transfer function of gain of the circuit; and a plurality of mixer slices coupled to the providing means, wherein a gain asymmetry variation is decreased (i.e., lessened) across all of the plurality of mixer slices.

In one or more embodiments, a transmitter is provided, comprising: a plurality of filter slices; a plurality of mixer slices coupled to the plurality of filter slices, wherein a gain asymmetry variation is decreased across all of the plurality of mixer slices, each of the plurality of mixer slices coupled to one of the plurality of filter slices; a calibration unit arranged to determine the characteristics of gain asymmetry; and a digital compensation unit arranged to adjust the gain of the transmitter over frequency.

In one or more embodiments an improved RC filter with slicing is provided.

Further embodiments, forms, objects, features, advantages, aspects, and benefits of the present application shall become apparent from the detailed description and drawings included herein.

DETAILED DESCRIPTION

The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiments shown, but is to be accorded the widest scope consistent with the principles and features described herein.

Figure 1:
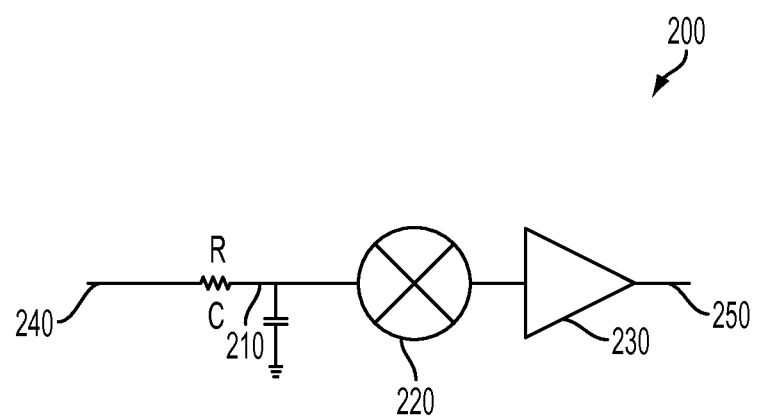
FIG. 1 depicts an RF front end circuit comprising an RC filter.
Figure 2:
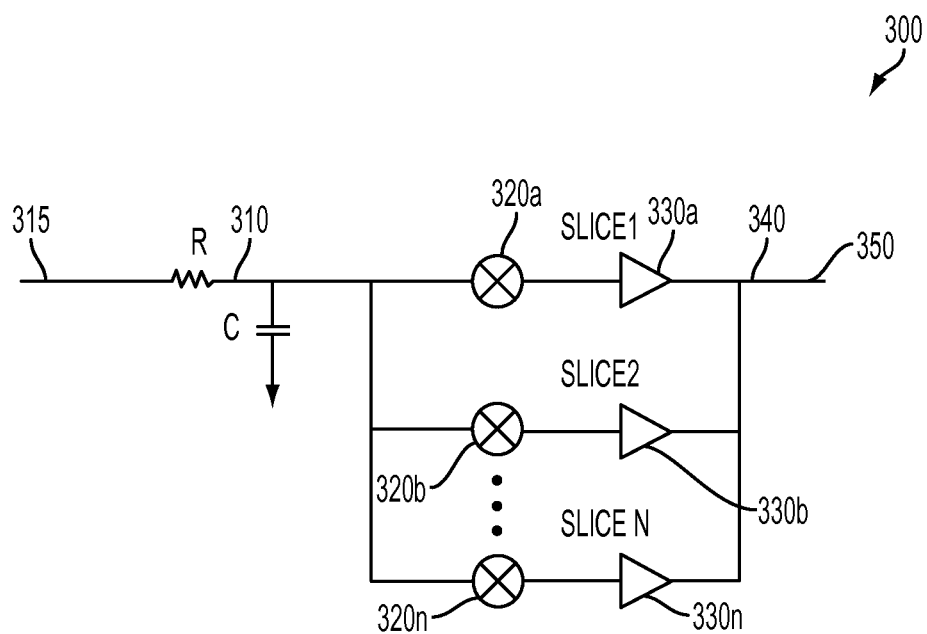
FIG. 2 depicts a typical topology for a transmitter for a radio frequency (RF) transceiver or chipset.
Figure 3:
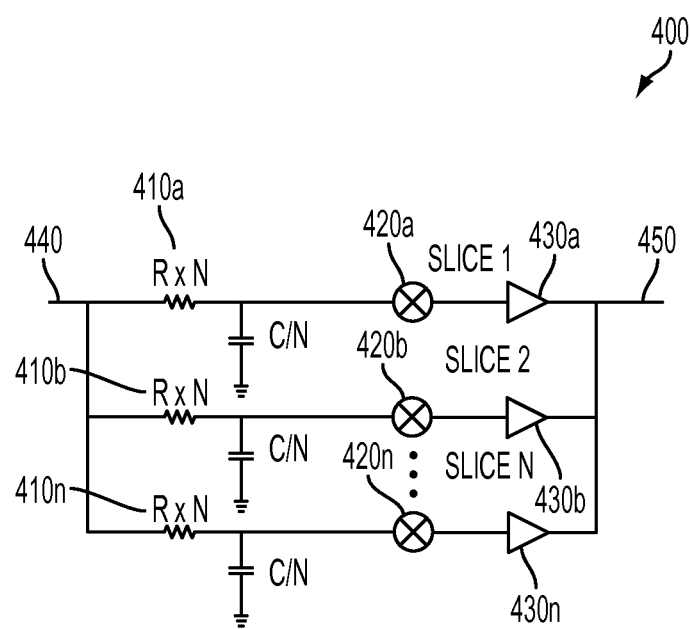
FIG. 3 illustrates an RF front end circuit comprising an improved RC filter slicing circuit in accordance with an embodiment of the present invention.

FIG. 3 illustrates an RF front end circuit comprising an improved RC filter slicing circuit in accordance with an embodiment of the present invention. From FIG. 3, a circuit 400 is configured to provide n (i.e. more than one) RC filters (410a-410n) connected with n mixers (420a-420n) which are connected with n amplifiers (430a-430n) to produce a substantially consistent gain asymmetry across slices. The RC filters 410 may further include values for R (reflected as R×N) and C (reflected as C/N) which are significant in relation to the input impedance of the plurality of mixers 420. N is an integer and is associated with the number of slices. Beneficially, for the circuit 400, in accordance with one or more embodiments, the AC response does not change over slice setting (i.e., number of enable RF paths). Input is at 440 and output is at 450. Further, operatively, a constant effective RC filter 3 db frequency with mixer loading effects is achievable and a residue 3 db frequency variation is boundable by RC tolerance after RC calibration, along with reduced maximum gain asymmetry. Gain asymmetry may be performed once for one or a plurality of slices where performance on the totality of supporting slices is not required by the present invention. As a result, beneficially, calibration time and complexity are greatly reduced.

Figure 4:
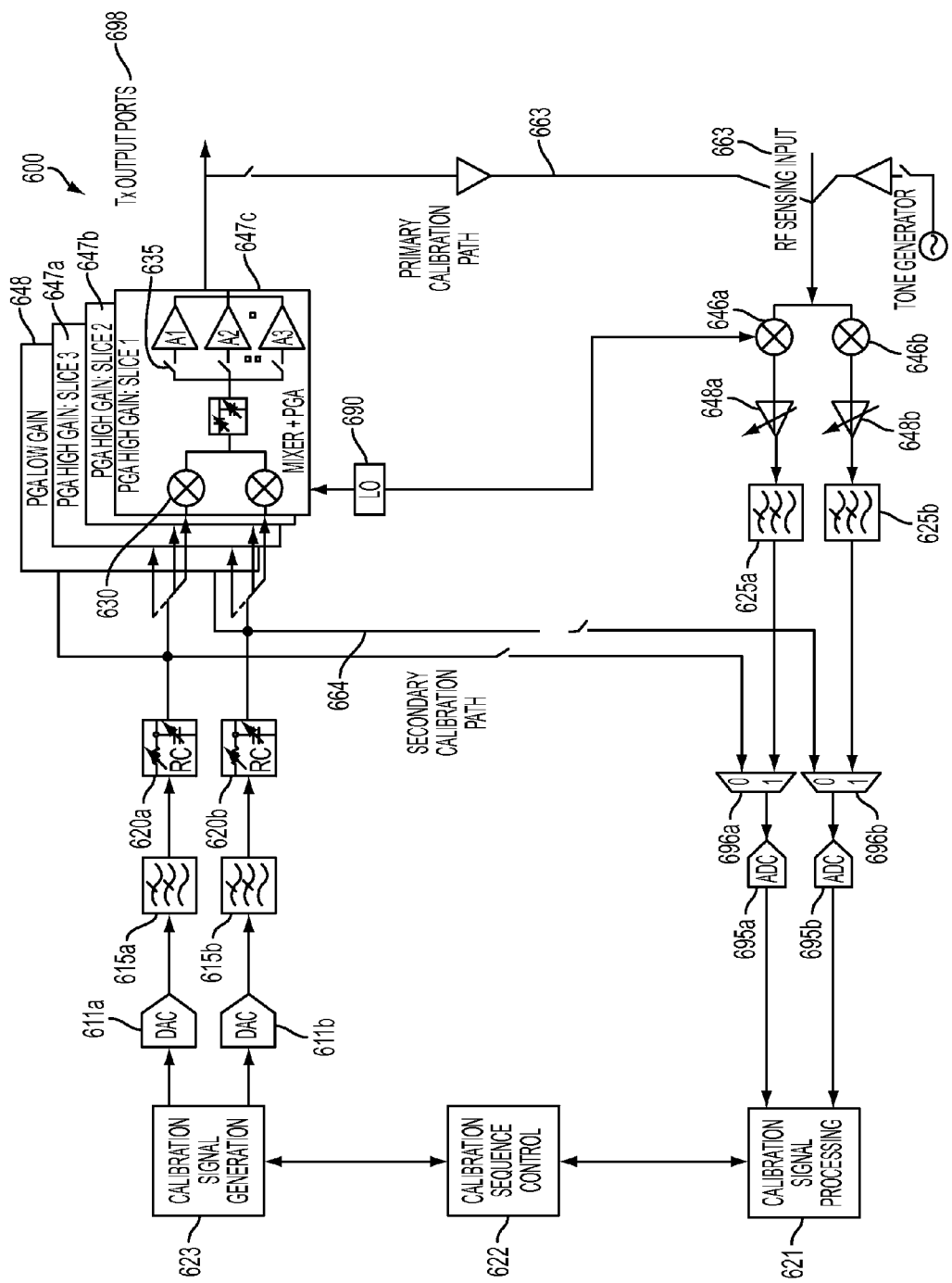
FIG. 4 depicts a calibration unit arranged to determine the characteristics of gain asymmetry in accordance with a further embodiment of the present invention.

FIG. 4 depicts a calibration unit 600 arranged to determine the characteristics of gain asymmetry in accordance with a further embodiment of the present invention. Benefits associated with the performances and more particularly those of gain asymmetry response, may be available in accordance with one or more embodiments of the present invention using the arrangement of the calibration unit of FIG. 4. For example, the calibration unit, in one or more embodiments performs one or more of, as needed, digital calibration compensation for correcting RF I/Q gain, RF I/Q phase and gain asymmetry resulting in an analog I/Q correction.

In FIG. 4, calibration signals are generated from the calibration signal generator 623 of the embodiments and are input to digital-to-analog converters (DACs) at 611a and 611b, respectively. The output signaling from DACs 611a and 611b includes signals I and Q as input to lowpass filters which comprise transfer-functions at 615a and 615b continuing to RC circuits 620a and 620b. Incoming signals are then input to up-conversion and amplifier banks 647a, 647b, 647c, each being of a specific mixer slice, and amplifier slice 648. In one or more embodiments, the banks include mixers and a plurality of programmable gain amplifiers.

Output from filters is available to output ports 698 and as data for calibration along primary calibration path 663, being determined from variation of data output from filters. Data along the primary calibration path is combined with RF sensing input 663 as input to mixers 646a, 646b, amplifiers 648a, 648b and lowpass filters 625a, 625b. Output from lowpass filters 625a and 625b and along the secondary calibration path 664 are input to mux devices 696a, 696b and then to analog-to-digital converts (ADC) 695a, 695b. Data for IQ calibration for low RF gain stages is determined along secondary calibration path 664. In an alternate arrangement, the pathway along 696 to 695 may involve data for DC calibration for lowpass filters and gain dependent DC.

Output from the ADCs is input to the calibration processor for processing at 621, which is then sequenced at the calibration sequence control at 622 for signal generation at the calibration signal generator 623. The sequence of the processor through generator (621-623) may, in one more embodiments, be deemed calibration signaling for gain asymmetry and other RF impairments. The calibration signaling may include software, hardware, firmware, control logic, programmable logic and/or any combination thereof and may reside locally or remotely as is contemplated by the embodiments of the present invention. Further, in an embodiment, a local oscillator (LO) at 690 is used to generate a signal for converting a signal to a different frequency prior to input to a mixer.

In one more exemplary arrangement, mixers on path 663 are generally suited for RF down-conversion and ADC is utilized to digitize the signal for DSP. In a further embodiment, a digital block function for impairment correction DSP, for performing signal characterization and correction (IQ/DC mismatch, asymmetry) coefficients calculations may also be utilized in which an output from the correction DSP to a digital filter of the present invention (such as that of FIG. 6, block 820) may be utilized. It will be appreciated that the present invention is suitable for a receiver, transmitter or transceiver and that the particular embodiment here is not intended to be restrictive to the entirety of the scope of the claims of the present invention.

From FIG. 4, RF I/Q gain correction is performed using calibration means such as the calibration unit in comparing the gain I/Q match (or mismatch) of baseband signal buffers, transceiver transmission buffers, transceiver RC circuit slice (s), and LO divider and buffer signals. For example, signals are compared for mismatch and the calibration unit applies a gain correction to digitally compensate for the mismatch, thereby providing for RF I/Q gain correction. By further example, signals of 625a/b are compared for phase mismatch and the calibration unit applies a phase correction to digitally compensate for the mismatch, thereby providing for RF I/Q phase correction.

From FIG. 4, gain asymmetry correction is performed using calibration means such as the calibration unit in comparing the gain asymmetry match (or mismatch) of transceiver transmission buffers, high band filters and programmable gain amplifier (PGA) outputs. For example, signals of 620a/b, 630 and 635 are compared for mismatch and the calibration unit applies a gain asymmetry correction to digitally compensate for the mismatch, thereby providing for gain asymmetry correction.

Figure 5:
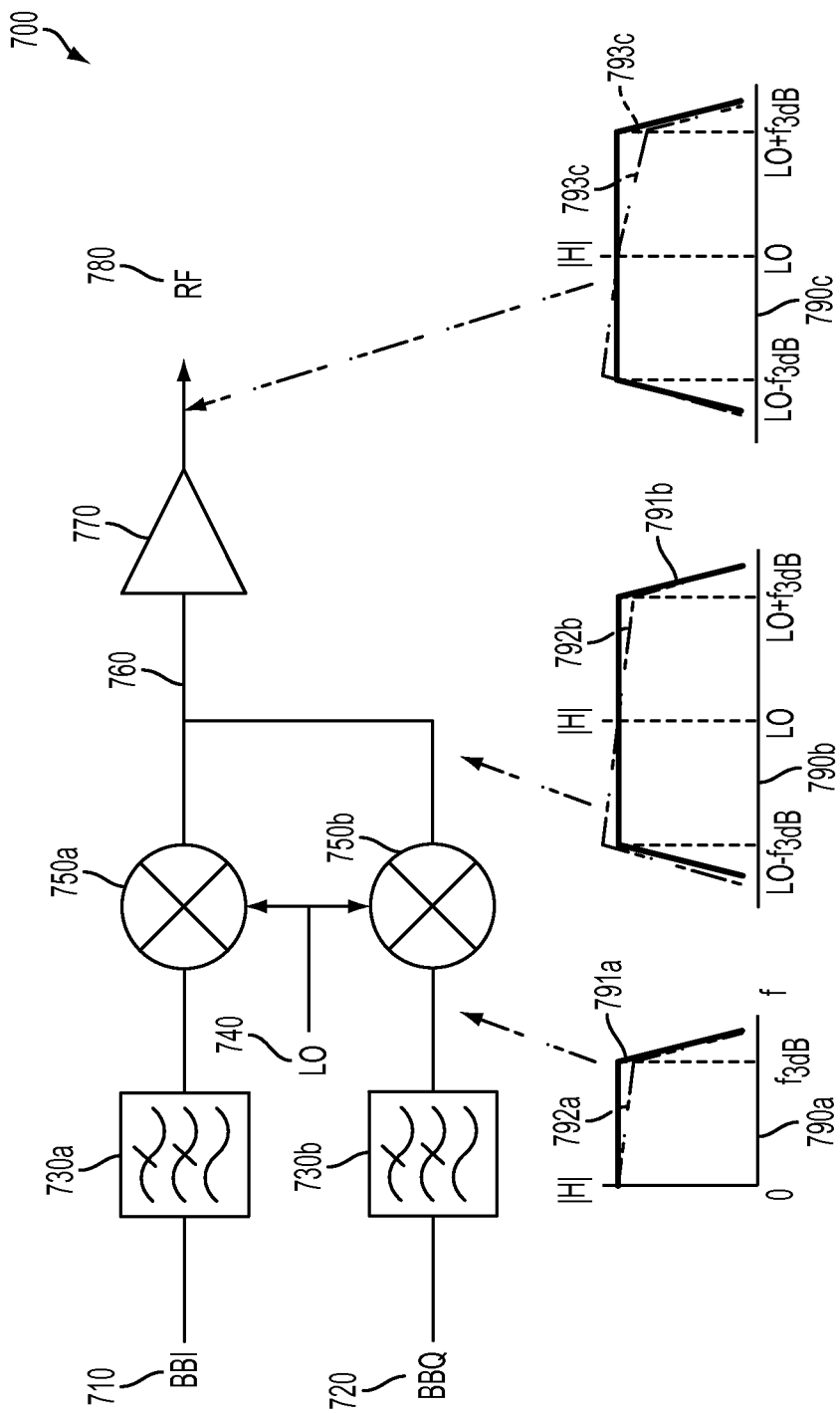
FIG. 5 sets forth an exemplary system transfer function methodology in accordance with an embodiment of the present invention.

FIG. 5 sets forth an exemplary system transfer function methodology 700 in accordance with an embodiment of the present invention. Benefits associated with the performances, and more particularly those of gain asymmetry response, may be available in accordance with one or more embodiments of the present invention using the arrangement of the calibration unit of FIG. 6.

From FIG. 5, signals from the baseband (BB) I and Q signal (710, 720) are passed into respective buffers (730a, 730b) and Local Oscillator (LO) 740, for tuning to be offset by the carrier frequency, provides output which is mixed with buffer outputs at respective mixers (750a, 750b). The mixer outputs are combined at 760 as input for the amplifier 770 and output to the RF at 780.

Also from FIG. 5 are performance oriented depictions showing skew associated with an embodiment of the present invention (790a, 790b, 790c). In each of the performance depictions (790a, 790b, 790c), the bold line (791a, 791b, 791c) denote the ideal flat in-band transfer function (i.e., frequency response) whereas the lighter line (792a, 792b, 792c) denote the non-ideal result from implementation of the transfer function. The frequency or spectrum flatness, as is understood by those skilled in the art, is suited for identifying associated skews as between these two measures for each performance depiction. For example, as part of a further embodiment of the present invention, a digital filter or equalizer is also utilized to recover spectrum flatness within the required tolerance and the equalizer provides a transfer function that compensates for the system transfer function to decrease the gain asymmetry variation. It will be further appreciated that the present invention may yield data curves of varying slope and linearity in implementation and application.

Figure 6:
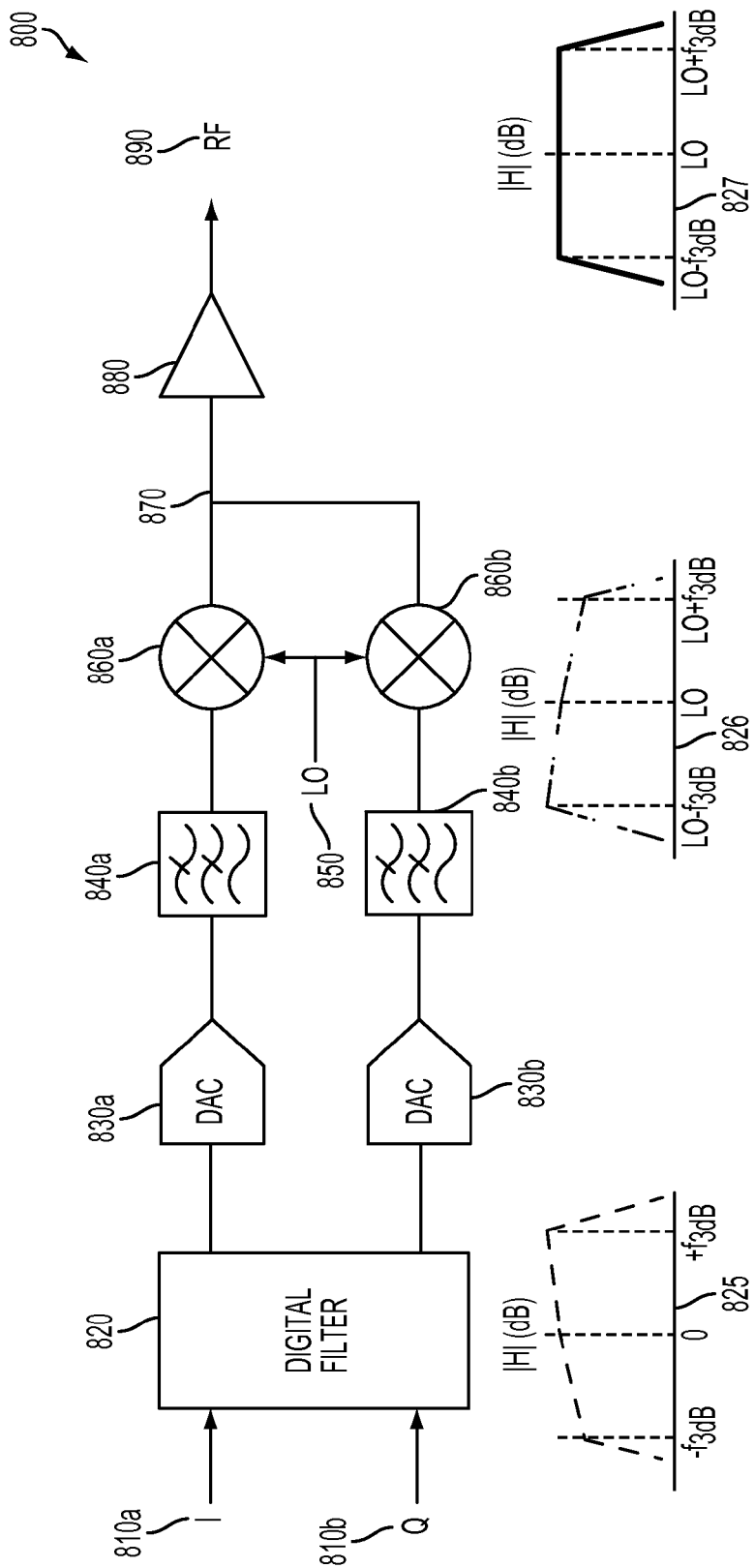
FIG. 6 illustrates an exemplary digital filter (i.e., equalizer) in accordance with one or more embodiments of the present invention.

FIG. 6 illustrates an exemplary digital filter (i.e., equalizer) 800 in accordance with one or more embodiments of the present invention. As described above, as part of a further embodiment of the present invention, a digital filter or equalizer (i.e., digital compensation unit, etc.) can be further incorporated to recover spectrum flatness within the required tolerance, where the equalizer is arranged to adjust the gain over frequency.

From FIG. 6, the digital filter 800 has BB signal inputs I and Q (810a, 810b) which pass to a digital equalizer 820. The digital equalizer has a transfer function which is similar to that shown at 825 though the specific representation is not required for the present invention. Representatively, the system transfer function (in-band) is shown at 826 and the overall transfer function (in-band) is depicted at 827. It will be appreciated that elements of the overall transfer function undergo change to seek to maintain spectrum flatness, where by example, the equalizer may provide a transfer function that compensates for the system transfer function to decrease the gain asymmetry variation.

Further from FIG. 6, signals output from the digital equalizer are then input to respective digital analog converters (DACs) (830a, 830b) and then passed through respective buffers, which also is intended to include low pass filters in one or more embodiments (840a, 840b). LO 850 provides output which is mixed with buffer (or low pass filter) outputs at respective mixers (860a, 860b). The mixer outputs are combined at 870 as input for the amplifier 880 and output to the RF at 890.

Operatively, for the present invention in one or more embodiments, the digital equalizer transfer function 825 may also be more complex. The digital equalizer transfer function complexity is associated with the RF gain asymmetry correction for the system transfer function 826, in accordance with the present invention, having the overall system transfer function 827. It will be appreciated by those familiar with the present invention that inconsistency in transfer function may occur such that one or more, or often multiple, digital filters are utilized to equalize spectrum flatness. The implementation of one or more digital filters in accordance with the present invention is provided to enable a consistent system transfer function among all chips (process variation), as the number of slices changes in operation, ensuring desired composite transfer function. For example, in one or more embodiments, the digital compensation unit comprises at least one of correcting RF I/Q gain, correcting RF I/Q phase, correcting gain asymmetry, and correcting analog I/Q.

In one embodiment of the present invention a parallel equivalent methodology (PEM) is provided. The PEM provides an approach where the circuit is sliced at a source that approximates or may nearly mimic a voltage source or a current source. As used herein, the term voltage source may include opamp output for instance and the term current source may include current mirrors for example.

Figure 7:
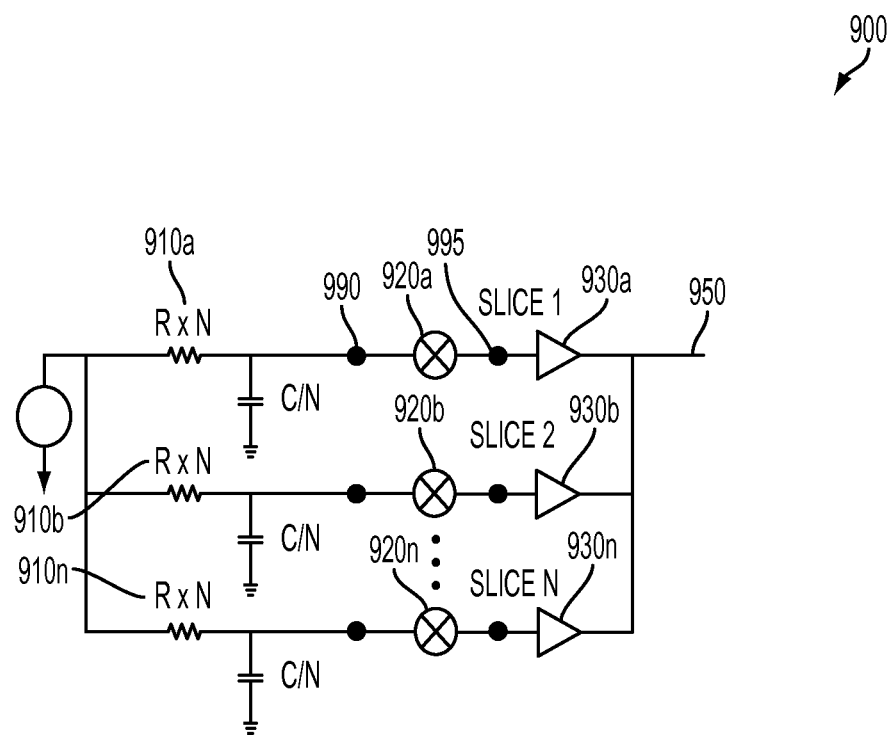
FIG. 7 depicts a circuit of the present invention having a consistent transfer function.

FIG. 7 depicts a circuit of the present invention 900 having a consistent transfer function. From FIG. 7, a circuit 900 is configured to have N slices where the circuit is sliced at a source that either mimics or approximates a voltage source or a current source. The circuit includes N (i.e. more than one) RC filters (910a-910n) connected with N mixers (920a-920n) which are connected with N amplifiers (930a-930n), where the slicing is a parallel configuration. Signal output is at 950. The impedance in the series may be scaled up by N such that R is scaled up to R×N, though over variations in view of MOSFET devices are envisioned by the present invention. Utilizing the approach of the present invention, the electrical voltage at the intermediate nodes is the same or nearly identical (such as at 990 and 995 by example). As one example of an implementation in a MOSFET device, for instance, the present invention can be scaled with device width or number of fingers.

The embodiments of the present invention provides for a transmitter having output power changes dynamically based on the signal integrity, such as that of mobile transmitter and a base-station or access point. In one or more embodiments, the present invention, when in frequency division duplex (FDD) mode for instance, the transmitter is always enabled, and the signal is transmitting continuously.

The embodiments of the present invention also provide for the ability to switch multiple digital equalization filters if the signal discontinuity is compensated. In one or more embodiments the present invention may be a transmitter or transceiver having reduced gain asymmetry variation. The embodiment of the present invention may also include a calibration unit arranged to determine the characteristics of the gain asymmetry and a digital compensation unit arranged to adjust the gain of the transmitter over frequency.

For the embodiments of the present invention, the circuit may also be operative as a transmitter, a receiver, a transceiver, or mobile transceiver device. Similarly, the system transfer function may also comprise an alternating current (AC) response of the circuit over gain and may be consistent over temperature.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion. Also, the term "couple" is intended to mean either an indirect or direct electrical connection. Accordingly, if one device is coupled to another device, that connection may be through a direct electrical connection, or through an indirect electrical connection via other devices and connections.

What is claimed is:

1. A circuit comprising:
   means for providing a consistent system transfer function of gain of the circuit; and
   a plurality of mixer slices coupled to the providing means, wherein a gain asymmetry variation is decreased across all of the plurality of mixer slices;
   wherein an input signal is sliced at a source that acts as either a voltage source or a current source and wherein the slicing is a parallel configuration; and an input impedance on each of the mixer slices is scaled up by N, where N is the number of mixer slices.

2. The circuit of claim 1, wherein the providing means comprises a plurality of RC filter slices and each of the plurality of RC filters slice coupled to a one of the plurality of mixer slices.

3. The circuit of claim 1, further comprising a calibration unit arranged to determine the characteristics of gain asymmetry.

4. The circuit of claim 3, further comprising a digital compensation unit arranged to adjust the gain of the circuit over frequency.

5. The circuit of claim 1, being operative as a transmitter.

6. The circuit of claim 1, being operative as a receiver.

7. The circuit of claim 1, wherein the system transfer function comprises an alternating current (AC) response of the circuit over gain.

8. The circuit of claim 1, wherein the system transfer function is consistent over temperature.

9. A transmitter comprising:
   a plurality of filter slices;
   a plurality of mixer slices, wherein each of the plurality of mixer slices coupled to one of the plurality of filter slices, and a gain asymmetry variation is decreased across all of the plurality of mixer slices;
   a calibration unit arranged to determine the characteristics of gain asymmetry; and
   a digital compensation unit arranged to adjust the gain of the transmitter over frequency;
   wherein the digital compensation unit comprises an equalizer,
   wherein the equalizer provides a transfer function that compensates for the system transfer function such that the gain asymmetry variation is decreased, and
   wherein the transfer function of the equalizer can be complex such that when the system transfer function changes, the equalizer transfer function will correct for that change to decrease the gain asymmetry variation.

10. The transmitter of claim 9, wherein each of the mixer slices comprises a mixer coupled to an amplifier.

11. The transmitter of claim 9, wherein an input signal is sliced at a source that acts as either a low impedance voltage source or a current source.

12. The transmitter of claim 11, wherein the current source comprises a current mirror.

13. The transmitter of claim 9, wherein the digital compensation unit comprises units for at least one of correcting RF I/O gain, correcting RF I/O phase, correcting gain asymmetry, and correcting analog I/O.

14. The transmitter of claim 9, wherein the system transfer function comprises an alternating current (AC) response of the transmitter over gain.

15. The transmitter of claim 9, wherein the plurality of filter slices are a plurality of active filter slices, a plurality of passive filter slices, or a plurality of RC filter slices.

* * * * *